(12) United States Patent
Cho (10) Patent No.: US 9,508,480 B2
(45) Date of Patent: Nov. 29, 2016

(54) VERTICAL SLOW-WAVE SYMMETRIC INDUCTOR STRUCTURE FOR SEMICONDUCTOR DEVICES

(75) Inventor: Hsiu-Ying Cho, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/222,665

(22) Filed: Aug. 31, 2011

(65) Prior Publication Data
US 2013/0049919 A1 Feb. 28, 2013

(51) Int. Cl.
*H01F 5/00* (2006.01)
*H01F 27/28* (2006.01)
*H01F 17/00* (2006.01)

(52) U.S. Cl.
CPC ..... *H01F 17/0013* (2013.01); *H01F 2017/008* (2013.01); *H01F 2017/0073* (2013.01); *H01F 2017/0086* (2013.01)

(58) Field of Classification Search
CPC ....... H01F 17/0013; H01F 5/00; H01F 27/36
USPC ......................................... 336/200, 223, 232
See application file for complete search history.

(56) References Cited

U.S. PATENT DOCUMENTS

| | | | | |
|---|---|---|---|---|
| 5,781,071 A | * | 7/1998 | Kusunoki | 330/269 |
| 6,291,872 B1 | * | 9/2001 | Wang et al. | 257/531 |
| 6,429,504 B1 | * | 8/2002 | Beaussart et al. | 257/531 |
| 6,927,664 B2 | * | 8/2005 | Nakatani et al. | 336/200 |
| 7,084,481 B2 | * | 8/2006 | Lowther et al. | 257/531 |
| 7,170,384 B2 | * | 1/2007 | Kim et al. | 336/200 |
| 7,564,319 B2 | * | 7/2009 | Ding et al. | 331/181 |
| 7,875,524 B2 | | 1/2011 | Kim | |
| 2007/0246798 A1 | | 10/2007 | Yeh et al. | |
| 2010/0033290 A1 | * | 2/2010 | Liu et al. | 336/200 |
| 2011/0254576 A1 | * | 10/2011 | Cho | 324/756.01 |

* cited by examiner

*Primary Examiner* — Elvin G Enad
*Assistant Examiner* — Ronald Hinson
(74) *Attorney, Agent, or Firm* — Duane Morris LLP (57) ABSTRACT

A vertical inductor structure in a semiconductor device includes a plurality of vertically oriented spirals that produce magnetic field in a dielectric material above the surface of a semiconductor substrate thereby preventing any eddy currents from propagating in the substrate. An inductor shield structure is also provided. The inductor shield structure is formed over the substrate surface and between an inductor such as the vertical inductor structure or other inductor types and also prevents eddy currents from being induced in the substrate. The inductor shield may surround the inductor to various degrees.

18 Claims, 6 Drawing Sheets

VERTICAL SLOW-WAVE SYMMETRIC INDUCTOR STRUCTURE FOR SEMICONDUCTOR DEVICES

TECHNICAL FIELD

The disclosure relates to semiconductor devices and more particularly to inductor structures used in high frequency RF semiconductor devices, and methods for manufacturing the same.

BACKGROUND

An inductor is a component constituting a circuit used in radio frequency (RF) transmission and reception, and is essentially and extensively used in RF semiconductor devices and analog devices which are widely used and gaining in popularity with the expansion of the wireless communication market. Conventional inductor structures in semiconductor devices are typically octagonal structures formed horizontally over a semiconductor substrate surface. Such inductor structures require and consume considerable amounts of substrate area and this represents a major disadvantage in the ongoing effort to reduce feature size, increase miniaturization and increase levels of integration. The inductance value of an inductor is directly related to the radius of the octagonally shaped horizontal inductor and therefore greater inductance values require an inductor that consumes a large amount of substrate area. This area consumption comes at the expense of additional device features for a fixed-size chip or requires a larger size chip to provide the same functionality. Either of these scenarios, i.e., a larger chip size or the need to utilize more chips to produce a component, increases cost to the consumer.

The performance of an inductor is indicated by the quality factor, Q, which is the ratio of energy stored in the inductor to the energy loss in the inductor. More particularly, Q is the ratio of an inductor's inductive reactance to its resistance at a given frequency, and is a measure of the inductor's efficiency.

Conventional inductor structures formed horizontally over a semiconductor substrate surface produce magnetic fields extending into the substrate and oriented such that the primary axis of the generated oblong magnetic field is normal to the substrate surface. There is thus a strong interaction between the magnetic field and the semiconductor substrate. In the presence of a magnetic field, electromagnetic induction results in an induced electromagnetic force, emf, which produces local currents in the conducting core normal to the magnetic flux. These currents are called eddy currents and the eddy currents are undesirably formed in the semiconductor substrate due to the location of the magnetic field and undesirably propagate through the semiconductor substrate. This results in power loss at high frequencies. Moreover, the performance of the inductor is degraded and difficult to predict as a result of complicated substrate effects when eddy currents propagate through the semiconductor substrate in high frequency devices.

It would therefore be desirable to provide an inductor structure that is efficient, includes a high Q factor, requires minimal substrate surface area and does not suffer from the above shortcomings and limitations.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1A-1D illustrate an exemplary inductor;

FIGS. 2A-2D illustrate an exemplary inductor structure with a substrate shield;

FIGS. 4A-4C illustrate another exemplary embodiment of an inductor structure with a shield.

DETAILED DESCRIPTION

Provided are inductor structures that each include a winding or spiral formed in dielectric materials disposed on or over a semiconductor substrate on which a semiconductor device is formed. Each spiral or winding is generally flat and oriented normal to the substrate surface such that current flows vertically in portions of the spiral or winding, referred to hereinafter simply as a spiral. The magnetic fields produced by the inductor spiral are situated above the substrate surface and in the dielectric, i.e. not in the semiconductor substrate. Any eddy currents produced as a result of electromagnetic force will be induced and propagate in the dielectric and not in the semiconductor substrate. As such, since any eddy currents are induced in the dielectric, the magnetic interaction between the inductor spiral and the semiconductor substrate is reduced, because the amount of current induced in a material varies inversely with the material's resistance and the resistance of a dielectric is considerably greater than the resistance of a semiconductor substrate such as silicon. Therefore, less eddy current is induced in the novel inductor structures compared to conventional inductors because the site of the induced eddy current is in dielectric material. Substrate shields are also provided.

In one exemplary embodiment, a semiconductor integrated circuit device with symmetric inductors with center-tap is provided. These and the other disclosed exemplary inductor structures find application in voltage control oscillator, VCO, RF circuits or other high frequency RF circuits. The inductor includes at least two generally flat spiral structures that are oriented normal to the substrate of the semiconductor substrate and therefore include a vertical current flow element through the spiral. This orientation provides a significant savings in substrate area compared to conventional inductor structures in which current flow is horizontal and always parallel to the planar substrate surface. Stated alternatively, a greater inductance can be provided in a given substrate area compared to conventional horizontal inductor structures in which current flow is parallel to the planar substrate surface.

Figure 1A:
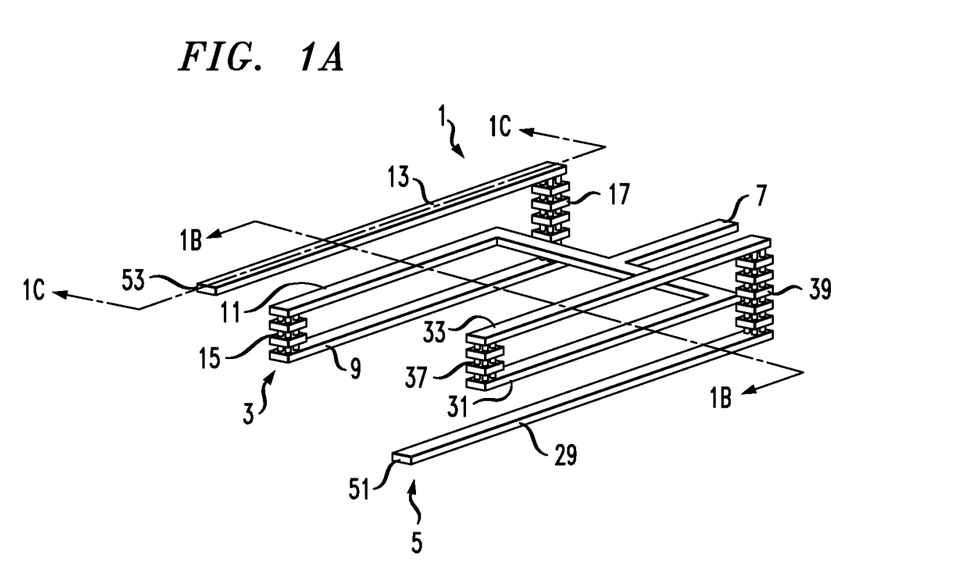
FIG. 1A is a perspective view of an exemplary inductor.
Figure 1B:
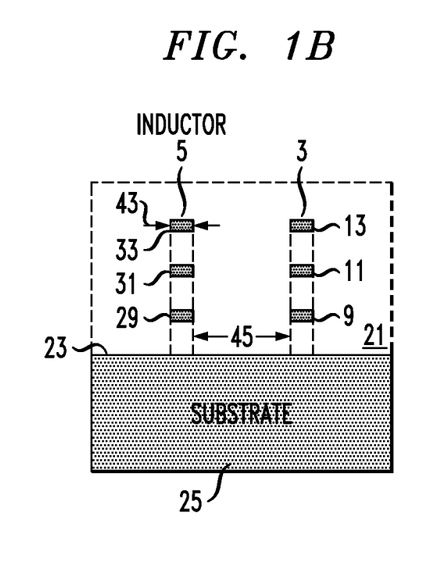
FIGS. 1B and 1C are cross-sectional views illustrating indicated portions of the inductor shown in FIG. 1A.
Figure 1C:
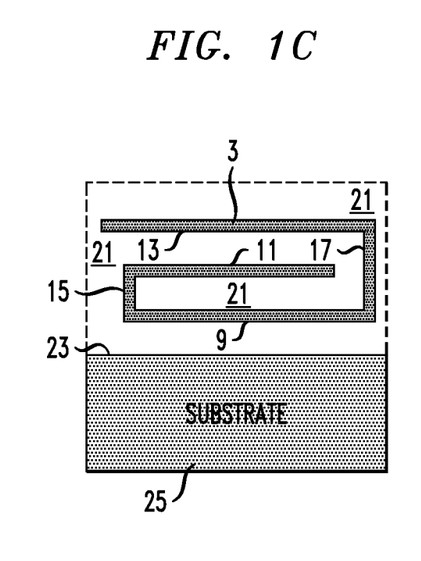

FIG. 1A is a perspective view of an exemplary inductor structure. Inductor 1 includes a duality of spirals 3 and 5. FIG. 1B is a cross-sectional view taken along line 1B-1B of FIG. 1A and FIG. 1C is a cross-sectional view taken along line 1C-1C of FIG. 1A.

Each of spirals 3 and 5 is generally flat in the vertical direction, as can also be seen in FIG. 1B. Spirals 3 and 5 are formed of conductive materials and are electrically coupled at center-tap 7, which may be coupled to AC ground or other appropriate circuitry such as $V_{DD}$ or $V_{SS}$, as suitable in RF circuitry. Spiral 3 includes metal 1 lead 9, metal 2 lead 11 and metal 3 lead 13 substantially aligned over one another. The leads are coupled by vertical conductive connectors 15 and 17 to form a spiral shown most clearly in cross-section in FIG. 1C. FIGS. 1B and 1C also illustrate that inductor 1 is formed in dielectric material 21 formed over substrate surface 23 of semiconductor substrate 25. Semiconductor substrate 25 may be silicon or other suitable semiconductor substrate materials used in the semiconductor manufacturing industry and particularly for RF devices.

According to each of the embodiments described herein, inductor 1 is formed as a component of a semiconductor integrated circuit device formed in and on semiconductor substrate 25. As such, semiconductor substrate 25 is understood to have a plurality of semiconductor devices formed in substrate surface 23, over substrate surface 23 or both in and over substrate surface 23. The other devices and components combine with the disclosed inductor or inductor structure to form a semiconductor integrated circuit device such as an analog semiconductor device. The semiconductor device may be a high frequency or other RF, radio frequency, semiconductor device and in various exemplary embodiments the semiconductor device may be a voltage controlled oscillator, VCO, RF circuit that performs various functions. The disclosed inductor structure which forms part of the semiconductor integrated circuit device is integrated into the device and coupled to other device features as known in the art.

Referring again to FIG. 1A, spiral 5 includes metal 1 lead 29, metal 2 lead 31 and metal 3 lead 33. Spiral 5 also includes vertical conductive connectors 37 and 39. Vertical conductive connectors 15, 17, 37 and 39 may consist of a plurality of metal or other conductive segments, vias and plugs. FIGS. 1A and 1B clearly illustrate that metal 1 leads 9 and 29 are formed from the same metal layer, arbitrarily designated metal 1 because it is the lowermost of the three illustrated metal layers that combine to form inductor 1 in the illustrated embodiment. Metal 2 leads 11 and 31 are formed from the same metal 2 layer, and so on. In other exemplary embodiments, including devices that include more than three metal layers, the disclosed inductor structure may be formed in any of three or more metal layers. Ports 51 and 53 are coupled to other components, devices or circuits as appropriate and depending on application.

Each of the described conductive and dielectric features may be formed using known methods and materials including known patterning techniques. Aluminum and copper and various alloys thereof are suitable metals that may be used for the metal 1, metal 2 or metal 3 leads and the vertical conductive connectors, but other suitable conductive materials may be used in other exemplary embodiments. Tungsten or any of various other suitable conductive plugs may form part of the vertical conductive connectors. Various material thicknesses may be used and the spacings between the respective metal levels and therefore the depths of the vertical conductive connectors may take on various values in various exemplary embodiments. Various metal lead widths 43 may be used and in one exemplary embodiment, width 43 may range from 2-12 microns, but other suitable widths may be used in other exemplary embodiments. Spirals 3 and 5 are separated by dielectric material 21 and spacing 45 which may vary depending on application, design factors and the desired inductance value.

FIGS. 1A-1C together illustrate that spirals 3 and 5 are substantially flat in the vertical direction, each having width 43, and are positioned normal to substrate surface 23 which is a planar surface. When current flows through the spirals, such as spiral 3 shown in FIG. 1C, current flows in the vertical direction through vertical conductive connectors 15 and 17 and vertical conductive connectors 37 and 39.

Figure 1D:
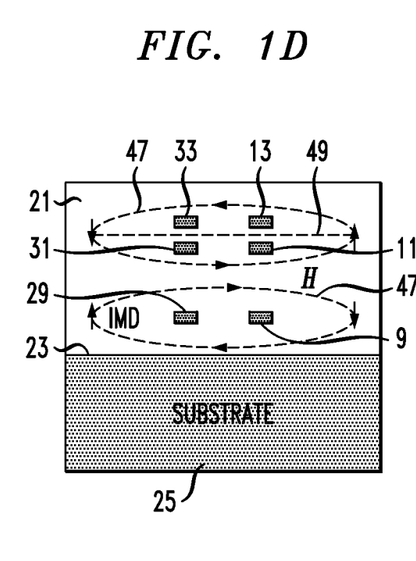
FIG. 1D is a cross-sectional view of a portion of the inductor structure of FIG. 1A and showing the resultant magnetic fields.

FIG. 1D also represents a cross-sectional view taken along line 1B-1B of FIG. 1A and is substantially similar to the cross-sectional view shown in FIG. 1B, but also indicates the magnetic fields induced by current flowing through the spirals. Magnetic fields 47 are indicated by dashed lines and arrows and are generally oval in shape. Each magnetic field 47 is disposed substantially above substrate surface 23. Primary axis 49 of magnetic field 47 is substantially parallel to substrate surface 23 which is a planar surface. Since magnetic fields 47 are substantially parallel and above substrate surface 23, any induced eddy currents will be induced in dielectric material 21, i.e. not in semiconductor substrate 25. Magnetic interaction between inductor 1 and semiconductor substrate 25 is thereby reduced.

Figure 2A:
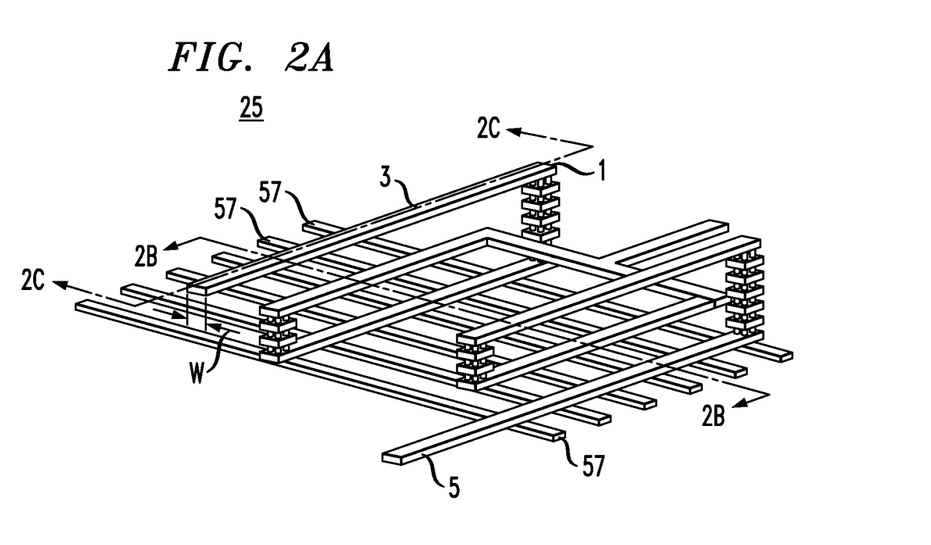
FIG. 2A is a perspective view of an exemplary inductor structure with a substrate shield.
Figure 2B:
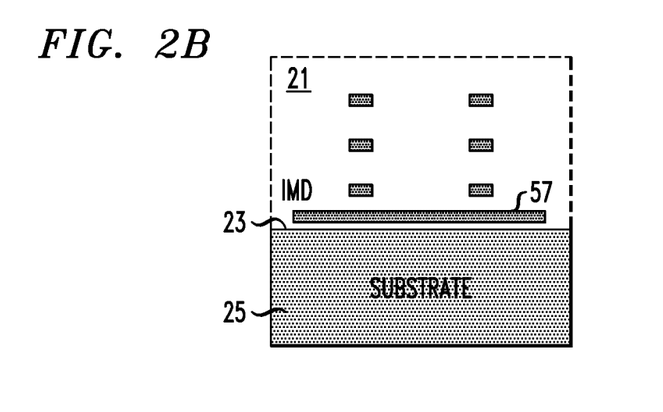
FIGS. 2B and 2C are cross-sectional views illustrating indicated portions of the inductor shown in FIG. 2A.
Figure 2C:
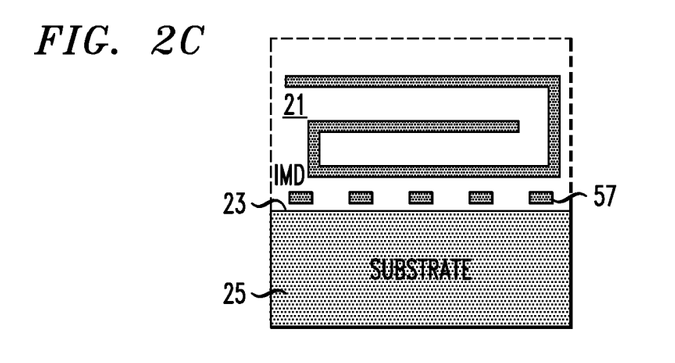

FIGS. 2A-2D shows another exemplary embodiment of an inductor with a slot-like shielding structure according to the disclosure. Inductor 1 is as described in conjunction with FIGS. 1A-1D. FIG. 2A is a plan view and FIG. 2B is a cross-sectional view taken along line 2B-2B of FIG. 2A. FIG. 2C is a cross-sectional view taken along line 2C-2C of FIG. 2A.

Inductor 1 is formed within dielectric material 21 and over semiconductor substrate 25 and FIGS. 2A-2C show a slot-type shielding structure including strips 57 formed between inductor 1 and substrate surface 23 and also within dielectric material 21. The slot-type shielding structure shields inductor 1 from semiconductor substrate 25 and vice versa and reduces magnetic interaction between inductor 1 and semiconductor substrate 25. Strips 57 may be formed of polysilicon, metal, a combination of polysilicon and metal such as polycide or other suitable conductive or semiconductor materials. Strips 57 are essentially parallel and include the same length in the illustrated embodiments.

Figure 2D:
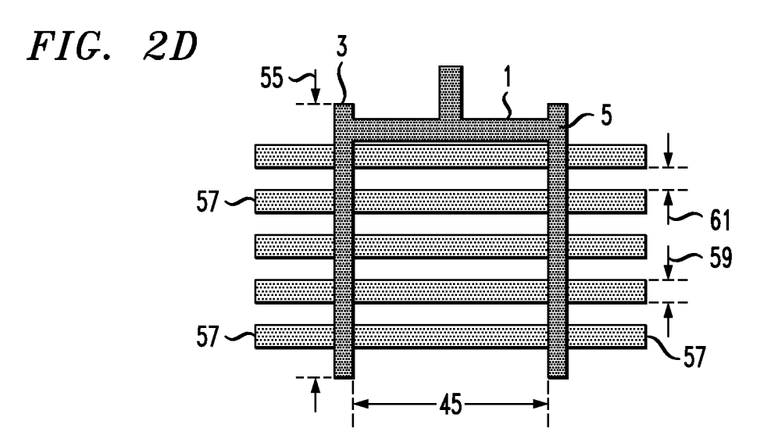
FIG. 2D is a top, plan view showing an exemplary inductor structure with a substrate shield.

FIG. 2D is a top, plan view showing inductor 1 with respect to strips 57, and also illustrates the slot-type shielding structure. Inductor 1 includes length 55 which may range from about 20 um to about 200 um in various exemplary embodiments and depending on the application and inductance desired. Strips 57 are separated from one another by dielectric material 21. Strips 57 may include a width 59 that may range from 0.1 to 1 micron or more in various exemplary embodiments and may be spaced apart by spacing 61 which may range from 0.07 to 1 micron or more in various exemplary embodiments, but these values are exemplary only and strips 57 and spacings 61 may include different dimensions in various other exemplary embodiments. Strips 57 extend parallel to one another and parallel to substrate surface 23 and are disposed normal to parallel spirals 3 and 5 in the exemplary embodiment. Strips 57 are also illustrated to extend between and outwardly past each of parallel spirals 3, 5.

Figure 3:
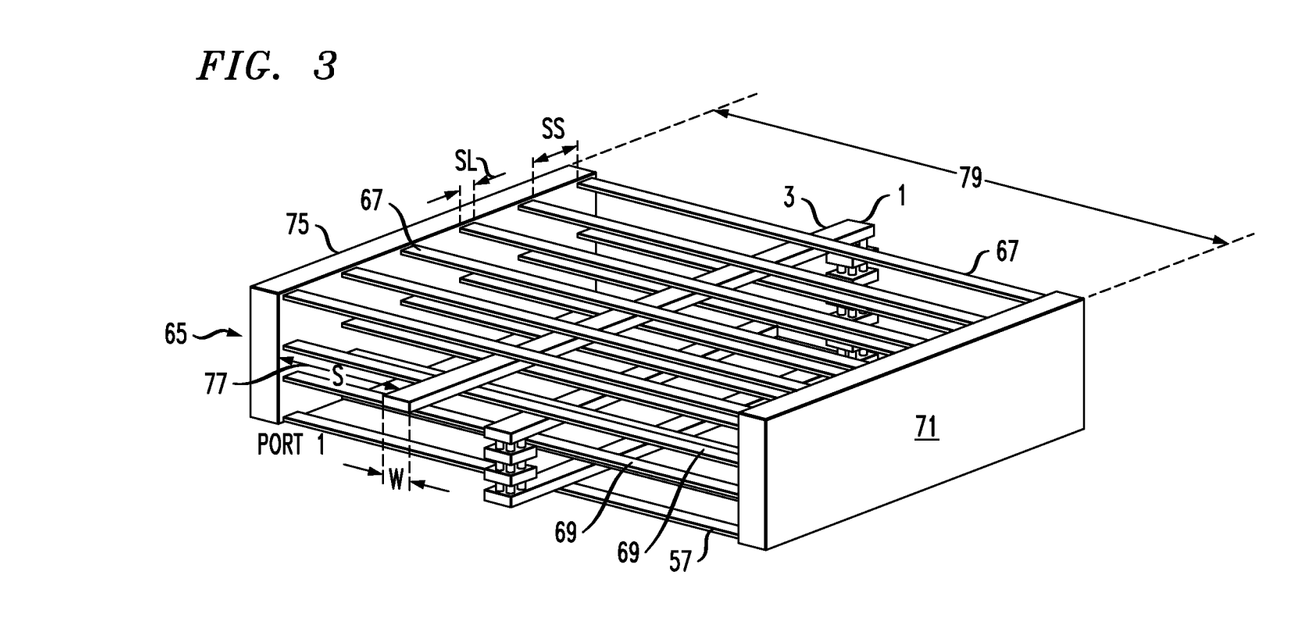
FIG. 3 is a perspective view of an exemplary inductor structure with an exemplary substrate shield.

The shielding structure such as shown in FIGS. 2A-2D and the shielding structure that will be shown in FIG. 3, each create a slow-wave feature which also produces a savings in device area, high quality factor, Q, performance and lower thermal noise. The shielding structures decelerate the propagation of electromagnetic waves. This reduction in phase velocity results in a corresponding reduction in wavelength and an increase in the effective relative permittivity of the dielectric material at a given operating frequency as it is known that the phase velocity, $V_p$, is a product of the operating frequency and wavelength. The reduced wavelength results in a savings of substrate surface area because, for a given inductance value, as the wavelength of the electromagnetic waves decreases, the area of the inductor required to produce the given inductance value, can be reduced accordingly. In some exemplary embodiments, wavelength may be reduced by about 50% compared to conventional structures, e.g. a wavelength of 1200 um at 60 GHz was achieved in one exemplary embodiment. This reduction in wavelength enables an area savings by reducing the number of turns and/or the length 55 of inductor 1.

FIG. 3 is a perspective view showing inductor 1 within a more extensive and robust shielding structure. Inductor 1, more clearly illustrated in FIGS. 1A and 2A, is partially obscured by shielding structure 65 in the exemplary embodiment illustrated in perspective view in FIG. 3. Shielding structure 65 additionally includes upper strips 67 and intermediate strips 69, each formed within dielectric material 21. Upper strips 67 are parallel to one another and to strips 57. Upper strips 67 are also coplanar. Intermediate strips 69 are disposed at multiple locations and are generally parallel to one another and to strips 57 and upper strips 67. Intermediate strips 69 extend through and between spirals 3 and 5 of inductor 1. In the illustrated embodiment, each of strips 57, upper strips 67 and intermediate strips 69 have the same length and extend between and laterally past spirals 3 and 5. Strips 57, upper strips 67 and intermediate strips 69 each have the same length and are all joined together at each of their opposed ends by respective endplates 71 and 75. Each of endplates 71, 75, upper strips 67 and intermediate strips 69 may be formed of the materials described in conjunction with strips 57, and may be formed of the same material as strips 57 in one exemplary embodiment. Shielding structure 65 provides further shielding and an enhanced slow-wave phenomenon. The dimensions and spacing of upper leads 67 and intermediate leads 69 may be as discussed, infra, in conjunction with strips 57, or they may differ. Spacing 77 between spiral 3 and end plate 75 may range from about 2 to about 10 microns in various exemplary embodiments and width 79 may range from about 10 um to about 100 um in various exemplary embodiments and will depend upon application and somewhat upon the size of inductor 1. Other widths may be used in other exemplary embodiments and will depend upon application and the other dimensions.

Figure 4A:
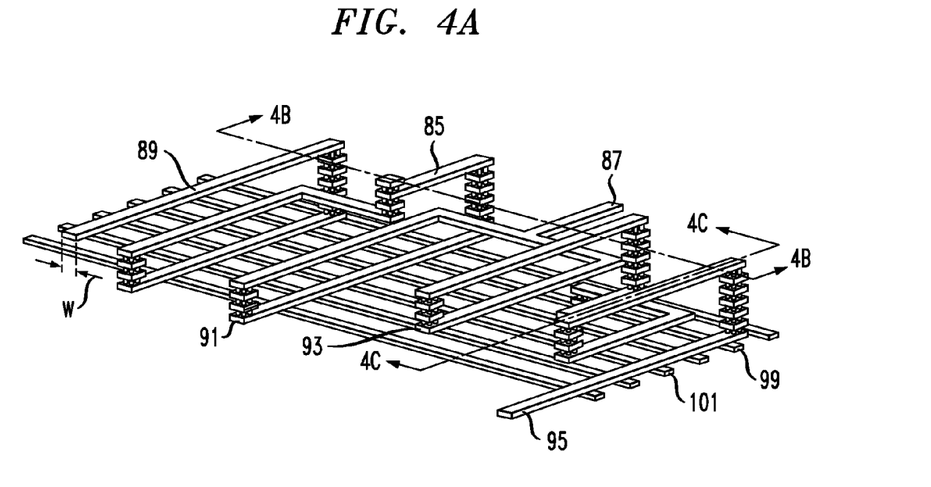
FIG. 4A is a perspective view.
Figure 4B:
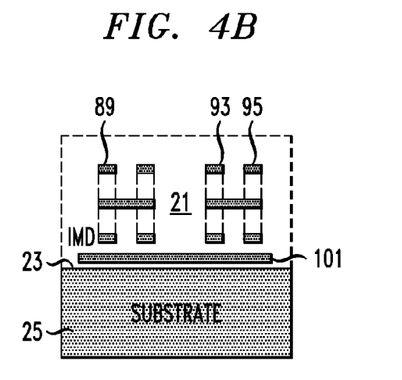
FIGS. 4B and 4C are cross-sectional views taken along a portion of FIG. 4A.
Figure 4C:
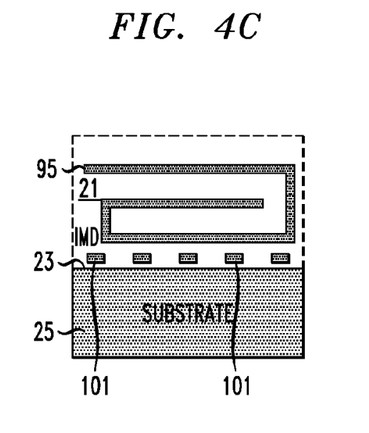

Another exemplary embodiment of an inductor structure is shown in FIGS. 4A-C. FIG. 4A is a perspective view and FIGS. 4B and 4C are cross-sectional views taken along lines 4B-4B and line 4C-4C, respectively. Inductor 85 includes center tap 87 to which each of individual spirals 89, 91, 93 and 95 are electrically coupled. As in other exemplary embodiments described supra, each of spiral 89, 91, 93 and 95 is formed of multiple metal leads from multiple metal layers and vertical conductive connectors. Spirals 89, 91 93 and 95 are each substantially flat and parallel to one another in the vertical direction and normal to substrate surface 23. Inductor 85 is formed within dielectric material 21 disposed over substrate surface 23 of semiconductor substrate 25.

FIGS. 4A-4C also illustrate shielding structure 99 which includes a plurality of shielding strips 101 disposed within dielectric material 21 and between substrate surface 23 and inductor 85. Shielding strips 101 may be formed of conductive or semiconductor material such as polysilicon, metal or a combination of polysilicon and metal such as polycide. Shielding structure 99 provides similar shielding phenomenon as described in conjunction with shielding structure 65 shown in FIG. 3 and the shielding structure shown in FIGS. 2A-2D.

The embodiment shown in FIGS. 4A-4C is intended to be exemplary only and in other exemplary embodiments, inductor 85 may include more or fewer spirals, the connection between the spirals may be oriented differently and the relative positions of the spirals may also be varied. In other exemplary embodiments, shielding structure 99 may not used with inductor 85 of FIGS. 4A-4C and in yet other exemplary embodiments, shielding structure 99 may be similar to the shielding structure shown in FIG. 3, i.e., the shielding structure may also be disposed over inductor 85, it may include opposed endplates and it may include strips extending through and between the spirals such as intermediate strips 69 of FIG. 3.

According to various other aspects, other embodiments may include various different structural details and advantageously include inductor structures with spiral structures that are generally flat in the vertical direction, oriented substantially normal to the substrate surface and formed in dielectric materials formed over the substrate surface. In other exemplary embodiments, the orthogonally disposed spiral inductor structures or other inductor structures formed in a dielectric material over a semiconductor substrate may be separated from the substrate by a shielding structure formed in the dielectric. The shielding structure may surround the inductor structure to various degrees.

According to one aspect, a semiconductor device is provided. The semiconductor device comprises an inductor structure formed on a semiconductor substrate with a planar substrate surface. The inductor structure comprises at least a duality of flat spiral conductive structures, each oriented normal to the planar substrate surface.

According to another aspect, an RF semiconductor integrated circuit is provided. The circuit comprises a semiconductor substrate with a planar substrate surface, a plurality of semiconductor devices disposed in or on the semiconductor substrate and an inductor device disposed over the semiconductor substrate and including vertical coil portions.

According to another aspect, a semiconductor device comprising an inductor structure formed in a dielectric material and over a semiconductor substrate with a planar substrate surface, and an inductor shield formed in said dielectric material between said inductor structure and said planar substrate surface, said inductor shield including a plurality of strips of conductor or semiconductor material separated by a dielectric period.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A semiconductor device comprising an inductor structure formed on a semiconductor substrate with a planar substrate surface, said inductor structure comprising at least two flat spiral conductive structures, each of said flat spiral conductive structures formed of at least three horizontal strips of conductive material vertically separated, each of said horizontal strips having a respective horizontal area, wherein a projected horizontal area of each of said flat spiral conductive structure is equal to said horizontal area of a longest one of said strips, wherein each of said horizontal strips of conductive material comprise outer edges that are vertically aligned with each other in a direction substantially normal to said planar substrate surface, and wherein said horizontal strips of conductive material of a first of said at least two flat spiral conductive structures and said horizontal strips of conductive material of a second of said at least two flat spiral conductive structures are aligned such that a primary axis of a magnetic field of the first flat spiral conductive structure is in line with a primary axis of a magnetic field of the second flat spiral conductive structure, further comprising a shield comprising a plurality of adjacent strips extending between at least two of the horizontal strips of the first and second flat spiral structures, and wherein said plurality of adjacent strips are perpendicular to said flat spiral structures.

2. The semiconductor device as in claim 1, wherein said at least three horizontal strips of conductive materials are formed in dielectric materials disposed over said planar substrate surface and said flat spiral conductive structures are electrically coupled and include a common center port coupled to ground.

3. The semiconductor device as in claim 1, wherein said vertically separated horizontal strips of conductive material comprise at least three metal layers, and vertical connective conductive structures and further comprising a shield at least partially surrounding said inductor structure, said shield comprising a plurality of adjacent strips formed of a semiconductor material and separated by a dielectric material.

4. The semiconductor device as in claim 1, wherein each of said flat spiral conductive structures includes at least one vertical conductive member disposed at different vertical locations, each said at least one vertical conductive member having the same horizontal area and coplanar lateral edges as said horizontal strips of conductive material.

5. The semiconductor device as in claim 1, wherein said inductor structure is formed in a dielectric disposed on said planar substrate surface and magnetic fields produced by said inductor structure are substantially above said planar substrate surface.

6. The semiconductor device as in claim 1, wherein magnetic fields produced by said inductor structure are oval in shape with primary axes substantially parallel to said planar substrate surface.

7. The semiconductor device as in claim 1, wherein said inductor structure is formed in a dielectric disposed on said planar substrate surface, wherein said shield at least partially surrounding said inductor structure, said plurality of adjacent strips separated by said dielectric material, said strips formed of one of a conductor and a semiconductor material.

8. The semiconductor device as in claim 7, wherein said shield includes said plurality of strips including strips disposed above and below said inductor structure, each of said plurality of strips having the same length and wherein each of said plurality of strips has each of their opposed ends joined together by a corresponding unitary endplate structure.

9. The semiconductor device as in claim 7, wherein said shield is formed of one of polysilicon, metal, or polysilicon and metal.

10. The semiconductor device as in claim 7, wherein said flat spiral conductive structures are substantially parallel to one another, disposed in and spaced apart by said dielectric material and electrically coupled together at a common central port and wherein said strips are disposed in said dielectric material and substantially orthogonal to said at least three horizontal conductive strips of said flat spiral conductive structures, and extend between and laterally past said at least three horizontal strips of conductive material of each of said at least two flat spiral conductive structures.

11. The semiconductor device as in claim 1, wherein said inductor structure comprises four said flat spiral conductive structures substantially parallel to one another and formed in dielectric materials disposed over said planar substrate surface, said flat spiral conductive structures coupled to one another and including a common center port coupled to ground.

12. The semiconductor device as in claim 1, wherein said semiconductor device is an RF device.

13. An RF semiconductor integrated circuit comprising:
a semiconductor substrate with a planar substrate surface;
an inductor device disposed over said semiconductor substrate, wherein said inductor device comprises at least two spiral coils each formed of at least three horizontal strips of conductive material vertically separated, each of said horizontal strips having a horizontal area, wherein a projected horizontal area of said flat spiral conductive structure is equal to said horizontal area of a longest one of said strips, wherein each of said horizontal strips of conductive material comprise outer edges that are vertically aligned with each other in a direction orthogonal to said planar substrate surface, and wherein said horizontal strips of conductive material of a first of said at least two spiral coils and said horizontal strips of conductive material of a second of said at least two spiral coils are aligned such that a primary axis a magnetic field of the first flat spiral conductive structure is in line with a primary axis of a magnetic field of the second flat spiral conductive structure; and a shield comprising a plurality of adjacent strips extending between at least two of the horizontal strips of the first and second flat spiral structures.

14. The RF semiconductor integrated circuit as in claim 13, wherein said inductor device is disposed in a dielectric material disposed over said planar substrate surface and said at least three horizontal strips of conductive material are formed of metal leads disposed over one another and formed from a plurality of metal layers, and wherein said at least three horizontal strips of conductive material are coupled by vertical conductive connectors.

15. A semiconductor device comprising an inductor structure formed in a dielectric material and over a semiconductor substrate with a substrate surface, and an inductor shield formed in said dielectric material between said inductor structure and said substrate surface, said inductor shield including a plurality of strips of conductive material or semiconductor material separated by a dielectric, a first end plate, and a second end plate, wherein said plurality of strips extend from the first end plate to the second end plate, and said inductor structure including at least two substantially flat spiral coils each formed of at least three horizontal strips of conductive or semiconductor material vertically separated by a dielectric, each of said at least three horizontal strips of conductive material having a horizontal area, and aligned directly over one another such that said inductor structure has a projected horizontal area equal to an area of a longest of one of said three horizontal strips of conductive material, and wherein said horizontal strips of conductive material of a first of said at least two substantially flat spiral coils and said horizontal strips of conductive material of a second of said at least two substantially flat spiral coils are aligned such that a primary axis a magnetic field of the first flat spiral conductive structure is in line with a primary axis of a magnetic field of the second flat spiral conductive structure, wherein said plurality of strips extending between at least two of the horizontal strips of the first and second flat spiral structures, wherein said plurality of adjacent strips are perpendicular to said flat spiral structures.

16. The semiconductor device as in claim 15, wherein said plurality of vertically separated strips of conductive material or semiconductor material are coplanar and substantially parllel to said substrate surface and wherein each of said at least two substantially flat spiral coils are oriented orthogonal to said substrate surface.

17. The semiconductor device as in claim 15, wherein said inductor shield further comprises a plurality of further strips of conductive material or semiconductor material disposed in said dielectric material and over said inductor structure and at least two opposed endplates of said conductive material or semiconductor material, each of said strips and said further strips having each of their opposed ends terminating at a corresponding one of said at least two opposed endplates.

18. The semiconductor device as in claim 17, wherein said inductor structure comprises at least two flat spiral coils, each oriented normal to said substrate surface and further comprising a plurality of intermediate strips of said conductive material or semiconductor material formed in said dielectric material and extending between said opposed endplates and through said at least two flat spiral coils.

\* \* \* \* \*